United States Patent
Wilson et al.

(10) Patent No.: US 7,741,172 B2
(45) Date of Patent: Jun. 22, 2010

(54) POSITIVE-INTRINSIC-NEGATIVE (PIN)/NEGATIVE-INTRINSIC-POSITIVE (NIP) DIODE

(75) Inventors: Robin Wilson, Newtownards (GB); Conor Brogan, Belfast (GB); Hugh J. Griffin, Newtownabbey (GB); Cormac MacNamara, Belfast (GB)

(73) Assignee: Icemos Technology Ltd., Belfast, Northern Ireland (GB)

(*) Notice: Subject to any disclaimer, the term of this patent is extended or adjusted under 35 U.S.C. 154(b) by 323 days.

(21) Appl. No.: 11/463,613

(22) Filed: Aug. 10, 2006

(65) Prior Publication Data
US 2007/0077725 A1    Apr. 5, 2007

Related U.S. Application Data

(60) Provisional application No. 60/706,918, filed on Aug. 10, 2005.

(51) Int. Cl.
*H01L 21/8234* (2006.01)

(52) U.S. Cl. .................. 438/237; 438/91; 438/328; 438/380; 438/979; 438/983; 257/E29.327; 257/E21.053; 257/E21.352

(58) Field of Classification Search .......... 438/91, 438/237, 328, 380, 979, 983; 257/46, 104, 257/106, 112, 199, E29.327, E21.053, E21.352
See application file for complete search history.

(56) References Cited

U.S. PATENT DOCUMENTS

| 6,368,932 B1* | 4/2002 | Goebel et al. ............... 438/380 |
| 6,426,991 B1 | 7/2002 | Mattson et al. |
| 6,762,473 B1 | 7/2004 | Goushcha et al. |
| 7,323,402 B2* | 1/2008 | Chiola ....................... 438/576 |
| 2001/0020704 A1* | 9/2001 | Kasahara et al. ............ 257/106 |
| 2003/0197247 A1* | 10/2003 | Mauder et al. ............. 257/603 |

FOREIGN PATENT DOCUMENTS

| WO | 2005001941 A3 | 1/2005 |
| WO | 2005031880 A1 | 4/2005 |

* cited by examiner

*Primary Examiner*—Michelle Estrada
(74) *Attorney, Agent, or Firm*—Panitch Schwarze Belisario & Nadel LLP

(57) ABSTRACT

A positive-intrinsic-negative (PIN)/negative-intrinsic-positive (NIP) diode includes a semiconductor substrate having first and second main surfaces opposite to each other. The semiconductor substrate is of a first conductivity. The PIN/NIP diode includes at least one trench formed in the first main surface which defines at least one mesa. The trench extends to a first depth position in the semiconductor substrate. The PIN/NIP diode includes a first anode/cathode layer proximate the first main surface and the sidewalls and the bottom of the trench. The first anode/cathode layer is of a second conductivity opposite to the first conductivity. The PIN/NIP diode includes a second anode/cathode layer proximate the second main surface, a first passivation material lining the trench and a second passivation material lining the mesa. The second anode/cathode layer is the first conductivity.

17 Claims, 5 Drawing Sheets

POSITIVE-INTRINSIC-NEGATIVE (PIN)/NEGATIVE-INTRINSIC-POSITIVE (NIP) DIODE

CROSS-REFERENCE TO RELATED APPLICATIONS

This application claims the benefit of Provisional Application No. 60/706,918 entitled Positive-Intrinsic-Negative (PIN)/Negative-Intrinsic-Positive (NIP) Diode, filed Aug. 10, 2005.

BACKGROUND OF THE INVENTION

Embodiments of the present invention relate to a positive-intrinsic-negative (PIN) or negative-intrinsic-positive (NIP) diode and a method for manufacturing a PIN/NIP diode, and more particularly, to a PIN/NIP diode having at least one trench and a method for manufacturing a PIN/NIP diode having at least one trench.

Positive-intrinsic-negative (PIN) diodes or PIN photodiodes are generally known in the art. A PIN diode is a type of photodiode with a large, neutrally doped intrinsic region sandwiched between p-doped and n-doped semiconducting regions. The PIN diode's name comes from the layering of these materials positive, intrinsic, negative (PIN). Broadly speaking, a photodiode is a semiconductor device that converts light to electrical current. A PIN diode typically exhibits an increase in its electrical conductivity as a function of the intensity, wavelength, and modulation rate of the incident radiation.

A PIN diode is also a semiconductor device that operates as a variable resistor at radiofrequency (RF) and microwave frequencies. The resistance value of the PIN diode is determined only by the forward biased direct current (DC) current. At high RF frequencies when a PIN diode is at zero or reverse bias, it appears as a parallel plate capacitor, essentially independent of reverse voltage.

FIG. 3 depicts a partial cross-sectional elevational view of a conventional planar PIN diode 510. A lightly doped intrinsic layer 516 separates more heavily doped p-type and n-type layers 514, 518 which function as anode and cathode, respectively. The sensor surface 516a is typically coated with an oxide or nitride passivation layer 512.

A PIN diode's effectiveness is related to the depletion region (i.e., the active detection area of the PIN diode). When a depletion area of a PIN diode is small, many electron-hole pairs recombine before they can create a current in the external circuit. Both the sensitivity and the output current are proportional to the depletion area. Accordingly, it is desirable to make the depletion region as large as possible.

It is desirable to provide a PIN/NIP diode having an increased effective surface area per unit area of device physical surface area. Further, it is desirable to provide a PIN/NIP diode having at least one trench.

BRIEF SUMMARY OF THE INVENTION

Briefly stated, an embodiment of the present invention comprises a positive-intrinsic-negative (PIN) diode that includes a semiconductor substrate having first and second main surfaces opposite to each other. The semiconductor substrate is of a first conductivity. The PIN/NIP diode includes at least one trench formed in the first main surface and at least one mesa. The at least one trench extends to a first depth position in the semiconductor substrate, and the at least one trench has a bottom and sidewalls. The at least one trench defines the at least one mesa in the first main surface. The PIN/NIP diode includes a first anode/cathode layer proximate the first main surface and the sidewalls and the bottom of the at least one trench. The first anode/cathode layer is a second conductivity opposite to the first conductivity. The PIN/NIP diode includes a second anode/cathode layer proximate the second main surface. The second anode/cathode layer being of the first conductivity. The PIN/NIP diode includes a first passivation material lining the bottom and sidewalls of the at least one trench and a second passivation material lining the at least one mesa.

Another embodiment of the present invention comprises a method of manufacturing a positive-intrinsic-negative (PIN) diode includes providing a semiconductor substrate having first and second main surfaces opposite to each other. The semiconductor substrate is of a first conductivity. At least one trench is formed in the first main surface of the semiconductor substrate. The at least one trench extends to a first depth position in the semiconductor substrate. The at least one trench defines at least one mesa in the first main surface. A first dopant of a first conductivity is implanted into the at least one mesa and the at least one trench to form a first anode/cathode layer. The first anode/cathode layer is of a second conductivity opposite to the first conductivity. A second dopant of a second conductivity opposite to the first conductivity is implanted into the second main surface to form a second anode/cathode layer. The second anode/cathode layer is of the first conductivity.

Another embodiment of the present invention comprises a method of manufacturing a positive-intrinsic-negative (PIN)/negative-intrinsic-positive (NIP) diode that includes providing a semiconductor substrate having first and second main surfaces opposite to each other. The semiconductor substrate is of a first conductivity. An epitaxial layer of the first conductivity is deposited on the first main surface of the semiconductor substrate. At least one trench is formed in the epitaxial layer. The at least one trench extends to a first depth position in the epitaxial layer, and the at least one trench defines at least one mesa in the epitaxial layer. The at least one mesa and the at least one trench are doped with a dopant of a second conductivity to form a first anode/cathode layer. The first anode/cathode layer being of the second conductivity opposite to the first conductivity.

Another embodiment of the present invention comprises a method of manufacturing a positive-intrinsic-negative (PIN)/negative-intrinsic-positive (NIP) diode that includes providing a first semiconductor substrate having first and second main surfaces opposite to each other. The first semiconductor substrate is of a first conductivity. A second semiconductor substrate having first and second main surfaces opposite to each other is provided, and the second semiconductor substrate is of the first conductivity. The second main surface of the first semiconductor substrate is bonded to the first main surface of the second semiconductor substrate. At least one trench is formed in the first main surface of the first semiconductor substrate. The at least one trench extends to a first depth position in the first semiconductor substrate. The at least one trench defines at least one mesa in the first main surface of the first semiconductor substrate. The at least one mesa and the at least one trench are doped with a dopant of a second conductivity to form a first anode/cathode layer and the second semiconductor substrate forms a second anode/cathode layer. The first anode/cathode layer is of the second conductivity opposite to the first conductivity.

Another embodiment of the present invention comprises a method of manufacturing a positive-intrinsic-negative (PIN)/negative-intrinsic-positive (NIP) diode that includes providing a semiconductor substrate having first and second main surfaces opposite to each other. The semiconductor substrate is of a first conductivity. An epitaxial layer of the first conductivity is deposited on the second main surface of the semiconductor substrate. At least one trench is formed in the first main surface of the semiconductor substrate. The at least one trench extends to a first depth position in the semiconductor substrate, and the at least one trench defines at least one mesa in the first main surface of the semiconductor substrate. The at least one mesa and the at least one trench are doped with a dopant of a second conductivity to form a first anode/cathode layer and the epitaxial layer forms a second anode/cathode layer. The first anode/cathode layer is of the second conductivity opposite to the first conductivity.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
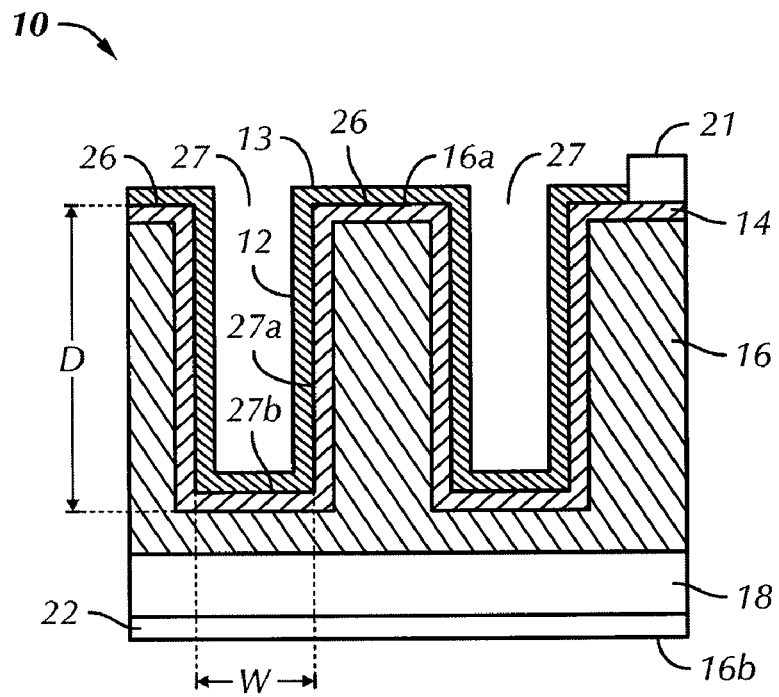
FIG. 1 is a partial cross-sectional elevational view of a positive-intrinsic-negative (PIN) diode having at least one trench in accordance with a first preferred embodiment of the present invention.

Certain terminology is used in the following description for convenience only and is not limiting. The words "right", "left", "lower", and "upper" designate directions in the drawings to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a" as used in the claims and in the corresponding portion of the specification, means "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Figure 2:
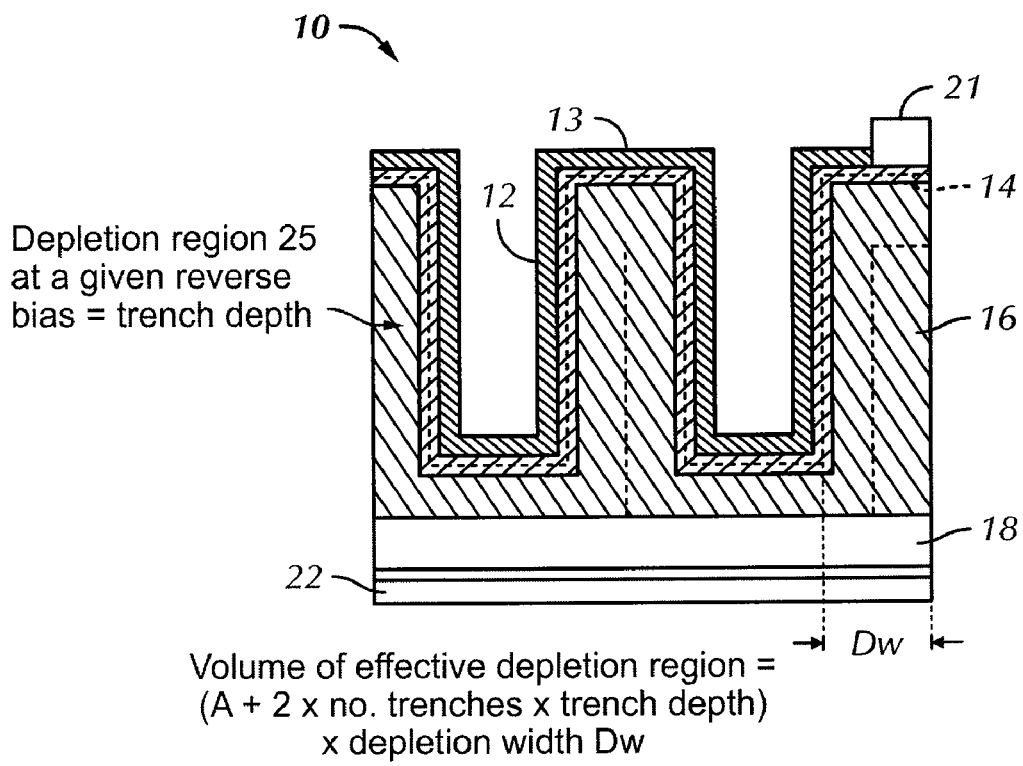
FIG. 2 is a partial cross-sectional elevational view of the PIN/NIP diode of FIG. 1 showing a depletion region.

Referring to the drawings in detail, wherein like numerals reference indicate like elements throughout, there is shown in FIGS. 1-2 a positive-intrinsic-negative (PIN) diode 10 in accordance with a first preferred embodiment of the present invention. The PIN/NIP diode 10 includes a semiconductor substrate 16 having first and second main surfaces 16a, 16b, respectively, opposite to each other. The semiconductor substrate 16 is of a first conductivity such as a lightly doped n-type. The PIN/NIP diode 10 includes at least one trench 27 formed in the first main surface 16a and at least one mesa 26. The at least one trench 27 extends to a first depth position D in the semiconductor substrate 16, and the at least one trench 27 has a bottom 27b and sidewalls 27a. The at least one trench 27 defines the at least one mesa 26 in the first main surface 16a. While shown as generally squared off in the drawings, the at least one trench 27 may actually be more rounded, U-shaped, V-shaped and the like due to the nature of the etching process which forms the at least one trench 27.

The PIN/NIP diode 10 includes a first anode/cathode layer 14 proximate the first main surface 16a and the sidewalls 27a and the bottom 27b of the at least one trench 27. The first anode/cathode layer 14 is of a second conductivity opposite to the first conductivity. Preferably, the first anode/cathode layer is a heavily doped p-type. The PIN/NIP diode 10 includes a second anode/cathode layer 18 proximate the second main surface 16b. The second anode/cathode layer 18 is the first conductivity such as heavily doped n-type.

Preferably, the PIN/NIP diode 10 includes a first passivation material 12 lining the bottom 27b and sidewalls 27a of the at least one trench 27 and a second passivation material 13 lining the at least one mesa 26. The PIN/NIP diode 10 also includes a backside contact 22 formed on the second anode/cathode layer 18 proximate the second main surface 16b and a peripheral contact 21 formed on the first anode/cathode layer 14 proximate the first main surface 16a.

It should be noted that the first conductivity can be one of p-type and n-type and the second conductivity can be the other one of p-type and n-type without departing from the invention. So the diode 10 may be positive-intrinsic-negative or negative-intrinsic-positive without departing from the invention and the name PIN/NIP diode 10 is used for explanatory purposes only and should not be construed as limiting.

Preferably, the semiconductor substrate 16 is formed of silicon (Si). But, the semiconductor substrate 16 may be formed of other materials such as gallium arsenide (GaAs), germanium (Ge) and the like.

Generally, if a semiconductor crystal contains no impurities, the only charge carriers present are those produced by thermal breakdown of the covalent bonds and the conducting properties are characteristic of the pure semiconductor material. Such a crystal is termed an "intrinsic" semiconductor. When used with reference to a PIN or NIP diode, conventional usage in the art includes lightly doped intrinsic areas. While used herein to refer to the semiconductor substrate 16

(FIG. 1) or substrate/epitaxial layer 116 (FIG. 8) as "intrinsic", the present invention recognizes that the PIN/NIP diode 10 in accordance with the present invention will work comparably with undoped substrates even when the semiconductor substrate 16 has been lightly doped or even more heavily doped. Accordingly, the term "intrinsic" should not be construed as limiting and the present invention can embrace pure and doped semiconductor substrates 16 formed of various materials.

Preferably, the first and second anode/cathode layers 14, 18 are heavily doped and the semiconductor substrate 16 is lightly doped.

Each of the first passivation material 12 and second passivation material 13 is one of an oxide, a nitride, a glass, polysilicon and combinations thereof. The first passivation material 12 and second passivation material 13 may be the same material and may be applied in the same processing step or may be different materials applied in different and/or other process steps.

Figure 3:
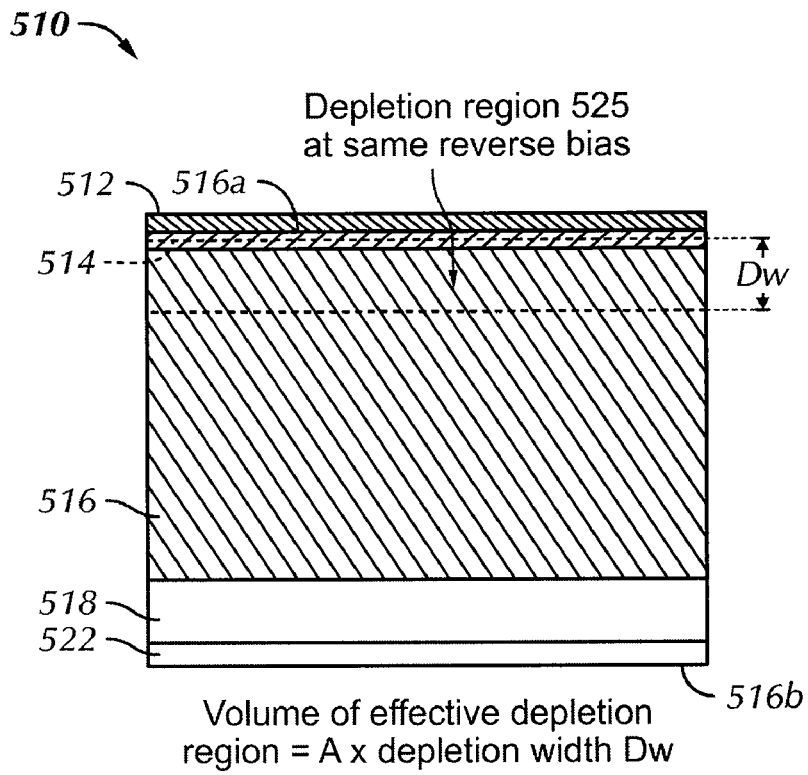
FIG. 3 is a partial cross-sectional elevational view of a conventional positive-intrinsic-negative (PIN) diode.
Figure 4:
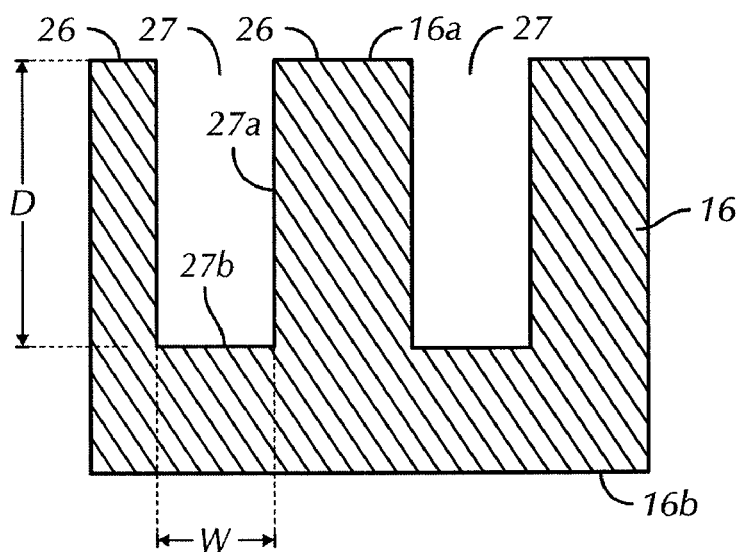
FIG. 4 is a partial cross-section elevational view of a semiconductor substrate having trenches and mesas formed therein.

Preferably, the PIN/NIP diode 10 includes a plurality of trenches 27 formed in the first main surface 16a and a plurality of mesas 26 defined by the plurality of trenches 27. By having a plurality of trenches 27 and a plurality of mesas 26, the effective surface area of the PIN/NIP diode 10 can be increased ten times or more. Since the sensitivity and output current of a PIN/NIP diode 10 is proportional to the effective surface area, a PIN/NIP diode 10 having an increased effective surface area will be more sensitive to light than a conventional planar PIN/NIP diode 510. For example, the volume of the effective depletion region 125 of the conventional planar PIN/NIP diode 510 depicted in FIG. 3 is the surface area times the depletion region width $D_w$. Whereas the volume of the effective depletion region 25 of the PIN/NIP diode 10 having a plurality of trenches 27 and a plurality of mesas 26 is the product of the depletion region width $D_w$ (FIG. 2) and the effective surface area. The effective surface area is the sum of the surface area of the plurality of mesas 26 plus two times the number of trenches 27 times the depth D of the trenches 27, as shown in equation (1).

$$V_{Depletion} = D_W \times (Mesa_{area} + 2 \times (N_{trenches} \times D)) \qquad \text{eqn. (1)}$$

where, $Mesa_{area}$=surface area of the plurality of mesas 26,
$N_{trenches}$=number of the plurality of trenches 27,
$D_w$=depletion region width, and
$V_{Depletion}$=volume of effective depletion region.

For example, for a given 1 millimeter (mm) by 1 mm diode, the conventional planar PIN diode 510 has a surface area of only 1 mm$^2$, but the PIN/NIP diode 10 having a 125 trenches 27 that are 4 micrometers or microns (μm) wide and 40 μm deep has an effective surface area of about 10 mm$^2$. Assuming that the depletion width $D_w$ is approximately the same for both diodes 10, 510, then the PIN/NIP diode 10 in the example has ten times the effective surface area than the conventional planar PIN/NIP diode 510.

An added benefit of the trenches 27, in addition to the increased effective surface area, is that the light entering the trenches 27 will mostly be absorbed with very little reflection. The trenches 27 form an inherently antireflective surface. The sidewalls 27a of the trenches 27 have an angle of inclination (not shown clearly) with respect to the second main surface 16b between about zero to 90 degrees. The angle of inclination can be designed to achieve full depletion of a particular substrate 16 having a fairly large thickness.

It should also be recognized that the PIN/NIP diode 10 having a plurality of trenches 27 can also be reduced in size as compared to a conventional planar PIN diode 510 for a similar application since the PIN/NIP diode 10 has an increased effective surface area due to the plurality of trenches 27 formed therein.

FIGS. 1 and 4-7 depict steps in a method of manufacturing the PIN/NIP diode 10 in accordance with the preferred embodiment of the present invention. The method of manufacturing a PIN/NIP diode 10 includes providing a semiconductor substrate 16 (FIG. 4) having first and second main surfaces 16a, 16b, respectively, opposite to each other. The semiconductor substrate 16 is of a first conductivity. At least one trench 27 is formed in the first main surface 16a of the semiconductor substrate 16. The at least one trench 27 extends to a first depth position D in the semiconductor substrate 16. The at least one trench 27 has a bottom 27b and sidewalls 27a and defines at least one mesa 26 in the first main surface 16a. Preferably, a plurality of trenches 27 are formed in the first main surface 16a of the semiconductor substrate 16 by a process such as plasma etching, Reactive Ion Etching (RIE), chemical etching and the like. Utilizing deep RIE, trenches 27 can be formed having depths D of about 40 to 100 μm or even deeper. Preferably, the plurality of trenches 27 thereby define a plurality of mesas 26 in the first main surface 16a.

The sidewalls of each trench 27 may be smoothed, if needed, using one or more of the following process steps:
(i) an isotropic plasma etch may be used to remove a thin layer of silicon (typically 100-1000 Angstroms (Å)) from the trench surfaces.
(ii) a sacrificial silicon dioxide layer may be grown on the surfaces of the trench and then removed using an etch such as a buffered oxide etch or a diluted hydrofluoric (HF) acid etch.

The use of either or both of these techniques can produce smooth trench surfaces with rounded corners while removing residual stress and unwanted contaminates. However, where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

Figure 5:
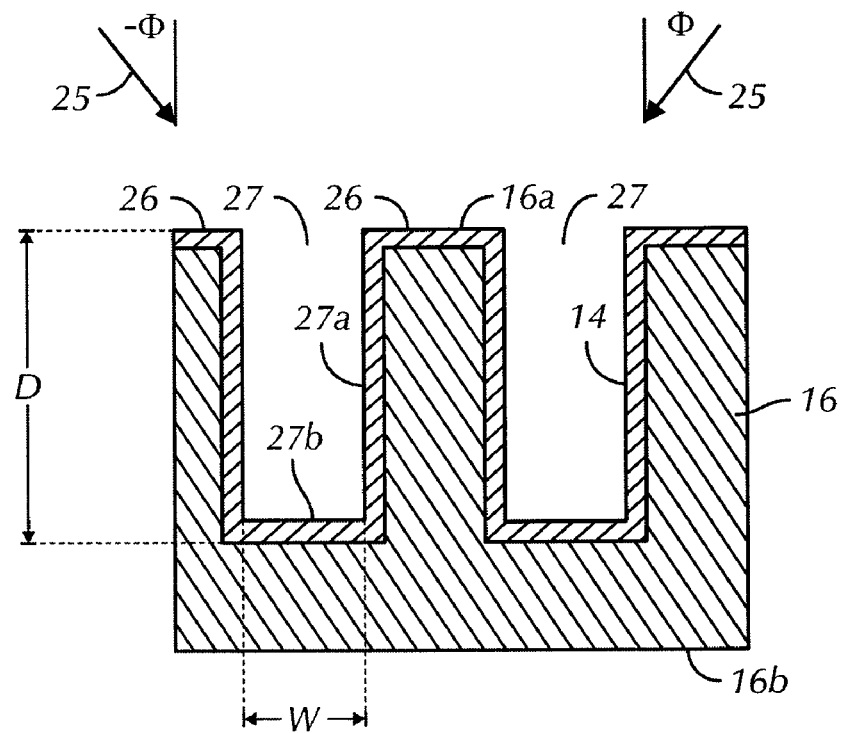
FIG. 5 is a partial cross-section elevational view of the semiconductor substrate of FIG. 4 during a first doping stage.

FIG. 5 shows that the first main surface 16a and the bottom 27b and sidewalls 27a of the at least one trench 27 are doped with a first dopant of a first conductivity to form the first anode/cathode layer 14. The first anode/cathode layer 14 is of a second conductivity opposite to the first conductivity. The doping is performed by one of ion implantation, solid diffusion, liquid diffusion, spin-on deposits, plasma doping, vapor phase doping, laser doping and the like. Doping with boron B results in a more p-type region, doping with phosphorus results in a more n-type region and doping with arsenic Ar results in a more n-type region. Other dopants may be utilized such as antimony Sb, bismuth Bi, aluminum Al, indium In, gallium Ga and the like depending on the material of the substrate 16 and the desired strength of the doping.

Preferably, the first and second dopants are applied by diffusion. The semiconductor substrate 16 is placed in a suitable diffusion chamber at about 700° C. to about 1200° C. proximate to a solid source such as boron or phosphorous. Alternatively, the semiconductor substrate 16 can be exposed to a liquid source of dopant at about 700° C. to about 1200° C.

Figure 6:
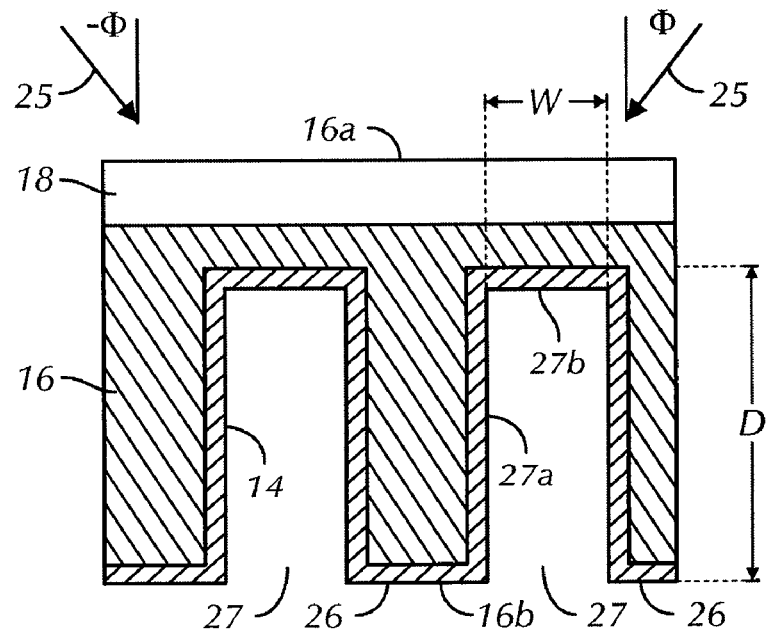
FIG. 6 is a partial cross-section elevational view of the semiconductor substrate of FIG. 5 during a second doping stage.

Alternatively, the first dopant may be implanted at a slight predetermined angle Φ to sufficiently implant the sidewalls 27a of the trenches 27. At the slight angle Φ, without benefits of a masking step, the mesas 26 are implanted by boron B, phosphorus P, arsenic As and the like, on one side at a high energy level in the range of about 40 to 1000 kilo-electronvolts (KeV). Preferably, the energy level is in the range of about 200 to 1000 KeV, but it should be recognized that the energy level should be selected to sufficiently implant the dopant. The predetermined angle of implant Φ, as represented by the arrows 25, is determined by the width A between the mesas 26 and the depth D of the trenches 27 and can be between about 2° and 12° from vertical with respect to the first main surface 16a. Consequently, a dopant of the second conductivity type is implanted, at a predetermined angle of implant Φ, into the first main surface 16a, the sidewall surfaces 27a and the bottoms 27b of the trenches 27. The opposite sides of the mesas 26 are implanted with boron B, phosphorus P, arsenic As and the like, at a negative predetermined angle of implant Φ, as represented by arrows 25. The negative predetermined angle of implant Φ is also determined by the width A and the depth D of the trenches 27 and can be between about −2° and −12° from vertical and for the embodiment shown the second predetermined angle of implant Φ' was at about −4°. Consequently, a dopant of the second conductivity type is implanted, at a negative predetermined angle of implant Φ, into the mesas 26, the sidewall surfaces 27a and the bottoms 27b of the trenches 27. A drive in step at a temperature of up to 1200° Celsius may be performed for up to 12 hours so that implanted dopant is sufficiently driven into the substrate 16. FIG. 6 shows that a second dopant of the first conductivity is implanted into the second main surface 16b to form a second anode/cathode layer 18. The second dopant may be by boron B, phosphorus P, arsenic Ar and the like. The second anode/cathode layer 18 is the first conductivity. Another drive in step at a temperature of up to 1200° Celsius may be performed for up to 12 hours so that implanted dopant is sufficiently driven into the substrate 16.

Figure 7:
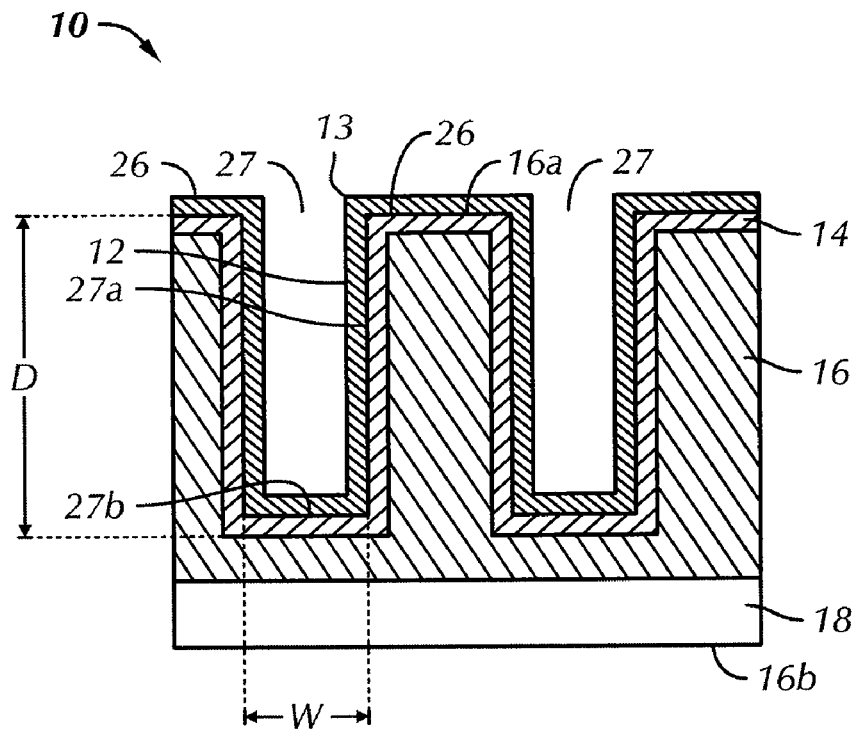
FIG. 7 is a partial cross-section elevational view of the semiconductor substrate of FIG. 6 during a passivation stage.

Referring to FIG. 7, the bottom 27b and sidewalls 27a of the plurality of trenches 27 are lined with a first passivation material 12, and the plurality of mesas 26 are lined with a second passivation material 13. Each of the first passivation material 12 and second passivation material 13 is applied using one of thermal growth, low pressure (LP) chemical vapor deposition (CVD), plasma enhanced chemical vapor deposition (PECVD), Atmospheric pressure chemical vapor deposition (APCVD), spun-on-glass (SOG), glass frit, deposition, direct application and combinations thereof. Each of the first passivation material 12 and second passivation material 13 is one of an oxide, a nitride, a glass and polysilicon. The first passivation material 12 and second passivation material 13 may be the same material and may be applied in the same processing step. Alternately, the first passivation material 12 and second passivation material 13 may be different materials which are applied in the different processing steps. While not required, the first and second passivation materials 12, 13 improve the performance of the resulting in the PIN/NIP diode 10.

A backside contact 22 is formed by sputtering, evaporation and/or electroplating on the second anode/cathode 18, and a peripheral contact 21 is similarly formed on the first anode/cathode 14 resulting in the PIN/NIP diode 10 shown in FIG. 1. The contacts 22, 21 may be a metal such as aluminum Al, aluminum silicon Al[% Si], copper Cu, gold Au, silver Ag, titanium Ti, tungsten W, nickel Ni and the like and combinations thereof or may be doped or undoped polysilicon. The contacts 22, 21 may also be layers of differing metals.

Other processing steps, as is known in the art, may be utilized without departing from the invention. For example, the trenches 27 may be smoothed, if needed, using processing steps such as isotropic plasma etch or deep ion etching such as deep RIE. Portions of the silicon substrate 16 or the entire device may have a sacrificial silicon dioxide layer grown thereon prior and then may be etched using a buffered oxide etch or a diluted hydrofluoric (HF) acid etch or the like to produce smooth surfaces and/or rounded corners thereby reducing residual stress and unwanted contaminants. Furthermore, additional layers in addition to the passivation layer(s) 12, 13 may be added as desired. Furthermore, the conductive semiconductor substrate 16 can be doped, implanted and/or diffused to achieve a particular conductivity.

Figure 8:
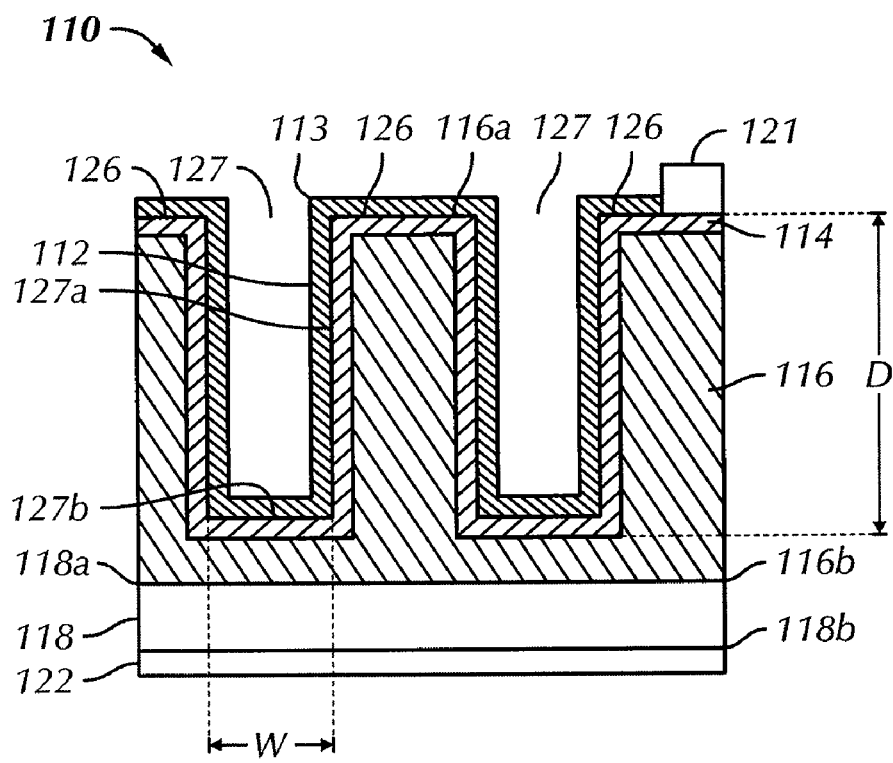
FIG. 8 is a partial cross-sectional elevational view of a positive-intrinsic-negative (PIN) diode having at least one trench in accordance with second-fourth preferred embodiments of the present invention.

Referring to FIG. 8, a method of manufacturing a PIN/NIP diode 110 in accordance with a second preferred embodiment of the present invention includes providing a semiconductor substrate 118 having first and second main surfaces 18a, 18b opposite to each other. The semiconductor substrate 18 is of a first conductivity. An epitaxial layer 116 of the first conductivity is deposited or grown on the first main surface 118a of the semiconductor substrate 118. The epitaxial growth or deposition may occur in a suitable reaction chamber at a temperature of up to about 1200° C. At least one trench 127 is formed in the epitaxial layer 116. The at least one trench 127 extends to a first depth position D in the epitaxial layer 116, and the at least one trench 127 defines at least one mesa 126 in the epitaxial layer 116. The at least one mesa 126 and the at least one trench 127 are doped with a dopant of a second conductivity to form a first anode/cathode layer 114. The first anode/cathode layer 114 is of the second conductivity opposite to the first conductivity. The semiconductor substrate 118 forms a second anode/cathode layer 118. The first and second anode/cathode layers 114, 118 are preferably heavily doped and the epitaxial layer 116 is preferably lightly doped. Preferably, a plurality of trenches 127 are formed in the epitaxial layer 116 thereby defining a plurality of mesas 126. Optionally, the plurality of trenches 127 are lined with a first passivation material 112, and the plurality of mesas 126 are lined with a second passivation material 113, similar to the method of the first preferred embodiment. A backside contact 122 is formed by sputtering, evaporation and/or electroplating on the second anode/cathode layer 118, and a peripheral contact 121 is similarly formed on the first anode/cathode layer 114 resulting in the PIN/NIP diode 110 shown in FIG. 8.

Referring again to FIG. 8, a method of manufacturing a PIN/NIP diode 110 in accordance with a third preferred embodiment of the present invention includes providing a first semiconductor substrate 116 having first and second main surfaces 116a, 116b opposite to each other. The first semiconductor substrate 116 is of a first conductivity. A second semiconductor substrate 118 having first and second main surfaces 118a, 118b opposite to each other is provided, and the second semiconductor substrate 118 is of the first conductivity. The second main surface 116b of the first semiconductor substrate 116 is bonded to the first main surface 118a of the second semiconductor substrate 118. The bonding process may include annealing the substrates 116, 118 in an annealing furnace at up to 1200° C. for a period of about a few minutes to six hours. Optionally, the bonding steps may include wetting the surfaces of the silicon substrates 116, 118 with a solution such as water ($H_2O$) and hydrogen peroxide ($H_2O_2$) and then pressing the wetted silicon substrates 116, 118 together and drying them prior to annealing at 800-1200° C. Plasma etches are used to remove impure oxides on the surfaces of the silicon substrates 116, 118 to be bonded. At least one trench 127 is formed in the first main surface 116a of the first semiconductor substrate 116. The at least one trench 127 extends to a first depth position D in the first semiconductor substrate 116. The at least one trench 127 defines at least one mesa 126 in the first main surface 116a of the first semiconductor substrate 116. The at least one mesa 126 and the at least one trench 127 are doped with a dopant of a second conductivity to form a first anode/cathode layer 114 and the second semiconductor substrate 118 forms a second anode/cathode layer 118. The first anode/cathode layer 114 is of the second conductivity opposite to the first conductivity. Preferably, a plurality of trenches 127 are formed in the first semiconductor substrate 116 thereby defining a plurality of mesas 126. Optionally, the plurality of trenches 127 are lined with a first passivation material 112, and the plurality of mesas 126 are lined with a second passivation material 113, similar to the method of the first preferred embodiment. A backside contact 122 is formed by sputtering, evaporation and/or electroplating on the second anode/cathode layer 118, and a peripheral contact 121 is similarly formed on the first anode/cathode layer 114 resulting in the PIN/NIP diode 110 shown in FIG. 8.

Referring again to FIG. 8, a method of manufacturing a PIN/NIP diode 110 in accordance with a fourth preferred embodiment of the present invention includes providing a semiconductor substrate 116 having first and second main surfaces 116a, 116b opposite to each other. The semiconductor substrate 116 is of a first conductivity. An epitaxial layer 118 of the first conductivity is deposited or grown on the second main surface 16b of the semiconductor substrate 116. The epitaxial growth or deposition may occur in a suitable reaction chamber at a temperature of up to about 1200° C. At least one trench 127 is formed in the first main surface 116a of the semiconductor substrate 116. The at least one trench 127 extends to a first depth position D in the semiconductor substrate 116, the at least one trench 127 defines at least one mesa 126 in the first main surface 116a of the semiconductor substrate 116. The at least one mesa 126 and the at least one trench 127 are doped with a dopant of a second conductivity to form a first anode/cathode layer 114 and the epitaxial layer 118 forms a second anode/cathode layer 118. The first anode/cathode layer 114 is of the second conductivity opposite to the first conductivity. Preferably, a plurality of trenches 127 are formed in the semiconductor substrate 116 thereby defining a plurality of mesas 126. Optionally, the plurality of trenches 127 are lined with a first passivation material 112, and the plurality of mesas 126 are lined with a second passivation material 113, similar to the method of the first preferred embodiment. A backside contact 122 is formed by sputtering, evaporation and/or electroplating on the second anode/cathode layer 118, and a peripheral contact 121 is similarly formed on the first anode/cathode layer 114 resulting in the PIN/NIP diode 110 shown in FIG. 8.

Accordingly, a PIN/NIP diode 10, 110 can be formed from a single substrate 16 that is appropriately doped on both sides; can be formed from multiple substrates 116, 118 that are bonded together and appropriately doped; can be formed from a substrate 118 with a epitaxial growth layer 116 which is suitably doped; or can be formed from a substrate 116 with an epitaxial growth layer 118 wherein the substrate 116 is appropriately doped.

Figure 9:
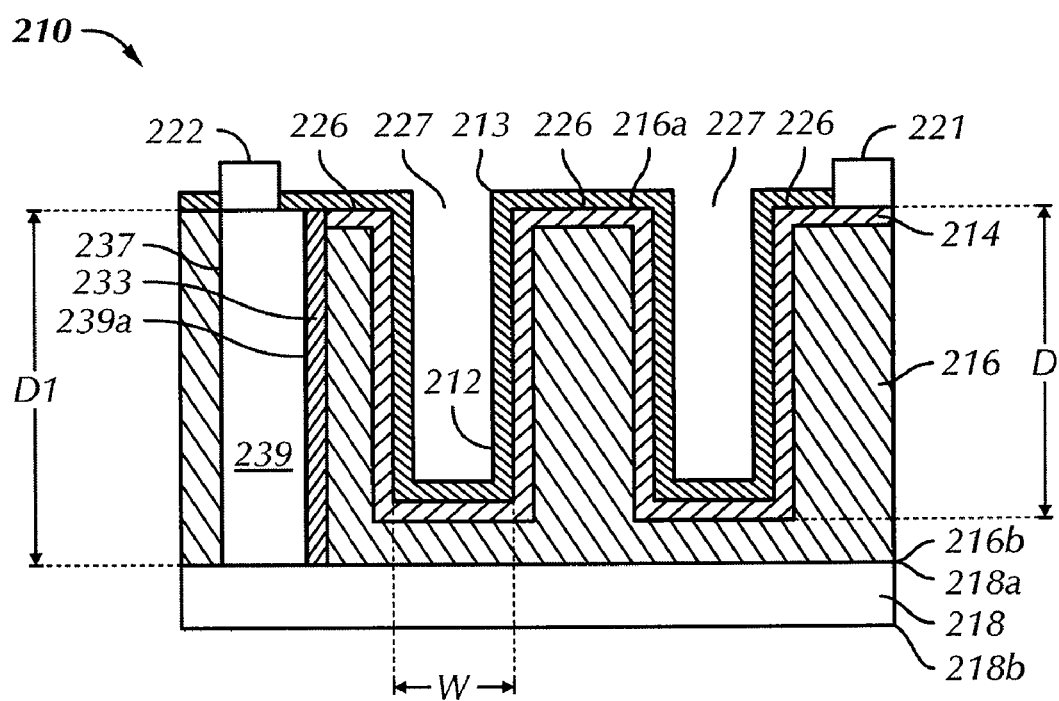
FIG. 9 is a partial cross-sectional elevational view of a positive-intrinsic-negative (PIN) diode having at least one trench and having front-side contacts in accordance with the preferred embodiments of the present invention.

FIG. 9 is a partial cross-sectional elevational view of a PIN/NIP diode 210 having at least one trench 227 and having front-side contacts 221, 222 in accordance with the preferred embodiments of the present invention. The PIN/NIP diode 210 includes a semiconductor substrate 216 having first and second main surfaces 216a, 216b, respectively, opposite to each other. The semiconductor substrate 216 is of a first conductivity such as a lightly doped n-type. The PIN/NIP diode 210 includes at least one trench 227 formed in the first main surface 216a and at least one mesa 226. The at least one trench 227 extends to a first depth position D in the semiconductor substrate 216, and the at least one trench 227 has a bottom 227b and sidewalls 227a. The at least one trench 227 defines the at least one mesa 226 in the first main surface 216a. Preferably, a plurality of trenches 227 are formed in the first main surface 216a of the semiconductor substrate 216 by a process such as plasma etching, RIE, chemical etching and the like. The PIN/NIP diode 10 includes a first anode/cathode layer 14 proximate the first main surface 16a and the sidewalls 27a and the bottom 227b of the at least one trench 227. The PIN/NIP diode 210 includes a first anode/cathode layer 214 is of a second conductivity opposite to the first conductivity. Preferably, the first anode/cathode layer is a heavily doped p-type. The PIN/NIP diode 210 includes a second anode/cathode layer 218 proximate the second main surface 216b. The second anode/cathode layer 218 is the first conductivity such as heavily doped n-type.

The PIN/NIP diode 210 also includes a contact trench 237 having a depth D1. The depth D1 of the contact trench 237 is sufficient to contact the second anode/cathode layer 218. A sidewall 239a of the contact trench 238 is coated with an insulating layer 233 by backfilling the contact trench 237 with the insulating material 233 and then selectively removing unwanted material 239 by a process such as etching. The insulating material 233 may be an oxide, a nitride and the like. The remainder of the contact trench 237 is then filled with a conductive fill material 239 such as a metal or doped or undoped polysilicon. The contact trench 237 provides a conductive path from the second anode/cathode layer 218 up to the first surface 216a of the semiconductor substrate 216. A first peripheral contact 21 is formed by sputtering, evaporation and/or electroplating on the first anode/cathode 214, and second peripheral contact 222 is similarly formed on the conductive fill material 239 resulting in the PIN/NIP diode 210 shown in FIG. 9. The contacts 222, 221 may be a metal such as aluminum Al, aluminum silicon Al[% Si], copper Cu, gold Au, silver Ag, titanium Ti, tungsten W, nickel Ni and the like and combinations thereof or may be doped or undoped polysilicon. The contacts 22, 21 may also be layers of differing metals.

From the foregoing, it can be seen that embodiments of the present invention are directed to a PIN/NIP diode having at least one trench and methods for manufacturing a PIN/NIP diode having at least one trench. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method of manufacturing a positive-intrinsic-negative (PIN)/negative-intrinsic-positive (NIP) diode comprising:
   providing a semiconductor substrate having first and second main surfaces opposite to each other, the semiconductor substrate being of a first conductivity;
   forming at least one trench in the first main surface, the at least one trench extending to a first depth position in the semiconductor substrate, the at least one trench defining at least one mesa in the first main surface;
   doping with a first dopant of a second conductivity the first main surface and the at least one trench to form a first anode/cathode layer, the first anode/cathode layer being of a second conductivity opposite to the first conductivity; and
   doping with a second dopant of the first conductivity the second main surface to form a second anode/cathode layer, the second anode/cathode layer being of the first conductivity;

lining the at least one trench with a first passivation material; and lining the at least one mesa with a second passivation material, wherein the first passivation material and second passivation material are the same material and are applied in the same processing step.

2. The method according to claim 1, wherein each of the first passivation material and second passivation material is applied using one of thermal growth, low pressure (LP) chemical vapor deposition (CVD), plasma enhanced chemical vapor deposition (PECVD), Atmospheric pressure chemical vapor deposition (APCVD), spun-on-glass (SOG), glass frit, deposition, direct application and combinations thereof.

3. The method according to claim 1, wherein each of the first passivation material and second passivation material is one of an oxide, a nitride, a glass, polysilicon and combinations thereof.

4. The method according to claim 1, wherein the first conductivity is one of p-type and n-type and the second conductivity is the other one of p-type and n-type.

5. The method according to claim 4, wherein the first and second anode/cathode layers are heavily doped and the substrate is lightly doped.

6. The method according to claim 1, wherein the at least one trench is formed utilizing one of plasma etching, Reactive Ion Etching (RIE) and chemical etching.

7. The method according to claim 1, wherein the at least one trench has sidewalls having an angle of inclination between about zero degrees and about +/− 90 degrees with respect to the second main surface.

8. The method according to claim 1, further comprising:
forming a backside contact on the second anode/cathode layer proximate the second main surface; and
forming a peripheral contact on the first anode/cathode layer proximate the first main surface.

9. The method according to claim 1, wherein the doping is performed by one of ion implantation, solid diffusion, liquid diffusion, spin-on deposits, plasma doping, vapor phase doping and laser doping.

10. A method of manufacturing a positive-intrinsic-negative (PIN)/negative-intrinsic-positive (NIP) diode comprising:
providing a semiconductor substrate having first and second main surfaces opposite to each other, the semiconductor substrate being of a first conductivity;
forming at least one active trench in the first main surface, the at least one active trench extending to a first depth position in the semiconductor substrate, the at least one active trench defining at least one mesa in the first main surface;
doping with a first dopant of a second conductivity opposite to the first conductivity the first main surface and the at least one active trench to form a first anode/cathode layer, the first anode/cathode layer being of a second conductivity opposite to the first conductivity;

doping with a second dopant of the first conductivity the second main surface to form a second anode/cathode layer, the second anode/cathode layer being of the first conductivity;
forming a contact trench in the first main surface that extends to the second anode/cathode layer; the contact trench having a first sidewall proximate the at least one active trench;
lining the first sidewall of the contact trench with an insulating material; and
filling the contact trench with a conductive material.

11. A method of manufacturing a positive-intrinsic-negative (PIN)/negative-intrinsic-positive (NIP) diode comprising:
providing a semiconductor device having first and second main surfaces opposite to each other, at least a portion of the semiconductor device being of a first conductivity;
forming at least one trench in the first main surface, the at least one trench extending to a first depth position in the semiconductor device, the at least one trench defining at least one mesa in the first main surface;
doping with a dopant of a second conductivity the at least one mesa and the at least one trench to form a first anode/cathode layer, the first anode/cathode layer being of a second conductivity opposite to the first conductivity; and
forming, at the second main surface, a second anode/cathode layer, the second anode/cathode layer being of the first conductivity;
lining the at least one trench with a first passivation material; and
lining the at least one mesa with a second passivation material, wherein the first passivation material and second passivation material are the same material and are applied in the same processing step.

12. The method according to claim 10, wherein the first conductivity is one of p-type and n-type and the second conductivity is the other one of p-type and n-type.

13. The method according to claim 10, wherein the first and second anode/cathode layers are heavily doped and the substrate is lightly doped.

14. The method according to claim 10, wherein the at least one active trench is formed utilizing one of plasma etching, Reactive Ion Etching (RIE) and chemical etching.

15. The method according to claim 10, wherein the at least one active trench has sidewalls having an angle of inclination between about zero degrees and about +/−90 degrees with respect to the second main surface.

16. The method according to claim 10, further comprising:
forming a backside contact on the second anode/cathode layer proximate the second main surface; and
forming a peripheral contact on the first anode/cathode layer proximate the first main surface.

17. The method according to claim 10, wherein the doping is performed by one of ion implantation, solid diffusion, liquid diffusion, spin-on deposits, plasma doping, vapor phase doping and laser doping.

* * * * *